US008097347B2

(12) United States Patent
Wegh et al.

(10) Patent No.: US 8,097,347 B2
(45) Date of Patent: Jan. 17, 2012

(54) LIGHT-EMITTING ELECTROCHEMICAL CELL (75) Inventors: Rene Theodorus Wegh, Eindhoven (NL); Edward Allen Plummer, Amsterdam (NL); Luisa De Cola, Amsterdam (NL); Eduard Johannes Meijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1055 days.

(21) Appl. No.: 11/572,219

(22) PCT Filed: Jul. 13, 2005

(86) PCT No.: PCT/IB2005/052330
§ 371 (c)(1),
(2), (4) Date: Jan. 17, 2007

(87) PCT Pub. No.: WO2006/011090
PCT Pub. Date: Feb. 2, 2006

(65) Prior Publication Data
US 2008/0096028 A1    Apr. 24, 2008

(30) Foreign Application Priority Data
Jul. 21, 2004    (EP) .................... 04103479

(51) Int. Cl.
C09K 11/06    (2006.01)
H01M 6/00    (2006.01)
C07F 19/00    (2006.01)
(52) U.S. Cl. .................... 428/690

(58) Field of Classification Search ............... 428/690, 428/917, 411.1, 336, 447, 704, 523, 480; 313/502–509; 257/40, 88, 104, E51; 532/1; 540/1; 546/2; 548/101, 103
See application file for complete search history.

(56) References Cited

U.S. PATENT DOCUMENTS
6,306,661 B1 * 10/2001 Lakowicz et al. ............ 436/138
2004/0108507 A1 * 6/2004 Grushin et al. ............... 257/79
2005/0025995 A1 * 2/2005 Cheng et al. .................. 428/690

FOREIGN PATENT DOCUMENTS
JP    60188931 A    2/1986

OTHER PUBLICATIONS

Lo, K. K.; Chung, C-K.; Lee, T. K-M.; Lui, L-H.; Tsang, K. H-K.; Zhu, N. Inorg. Chem. 2003, 42, 6886-6897.*
Lo, K. K-W.; Chung, C-K.; Lee, T. K-M.; Lui, L-H.; Tsang, K. H-K.; Zhu, N. Inorg. Chem. 2003, 42, 6886-6897.*
Lo, K. K-W.; Li, C-K.; Lau, K-W.; Zhu, N. Dalton Trans., 2003, 4682-4689.*
M.S. Lowry et al; "Accelerated Luminophore Discovery Through Combinatorial Synthesis", J. Am. Chem Soc., vol. 12, No. 43, Aug. 10, 2004, pp. 14129-14135, XP002354213.

(Continued)

*Primary Examiner* — Angela Ortiz
*Assistant Examiner* — J. L. Yang (57) ABSTRACT

A light-emitting electrochemical cell includes at least two electrodes, and an electroluminescent material arranged between the two electrodes. The electroluminescent material includes a charged metal complex. The charged metal complex has at least one metal atom selected from the group consisting of Ir, Os, Pt, Re and Zn, with the proviso that the metal complex is different from $[Ir(ppy)_2(dtb\text{-}bpy)]^+(PF_6^-)$ and $[Os(bpy)_2(dppe)]^{2+}(PF_6^-)_2$.

8 Claims, 5 Drawing Sheets in contact at $V > E_g/e$

OTHER PUBLICATIONS

J. I. Goldsmith et al; "Discovery and High-Throughput Screening of Heteroleptic Iridium Complexes for Photoinduced Hydrogen Production", J. Am. Chem. Soc., vol. 12, No. 20, Apr. 28, 2005, pp. 7502-7510, XP002354212.

K. K. Lo et al; "Luminescent Cyclometallated Rhodium (III) Bis (Pyridylbenzaldehyde) Complexes With Long-Lived Excited States", J. Chem. Soc. Dalton Trans., vol. 24, Oct. 14, 2003, pp. 4682-4689, XP002354214.

K.K. Lo et al; "New Luminescent Cyclometalated Iridium (III) Diimine Complexes As Biological Labeling Reagents", Inorganic Chemistry, vol. 42, No. 21, Sep. 17, 2003, pp. 6886-6897, XP002354215.

* cited by examiner no contact

Fig. 1a in contact at $V > E_g/e$

LIGHT-EMITTING ELECTROCHEMICAL CELL

FIELD OF THE INVENTION

The present invention relates to a light-emitting electrochemical cell comprising at least two electrodes, and an electroluminescent material arranged between said two electrodes, wherein the electroluminescent material comprises a charged metal complex. It also relates to a method for manufacturing light-emitting electrochemical cells, and to substances which may be used as electroluminescent substances.

BACKGROUND OF THE INVENTION

Due to rapid progress in the development of organic light-emitting materials, devices based on these materials, called PLEDs and OLEDs (polymer and small-molecule organic light-emitting diodes), are entering the display market. In principle these materials can also be used for large-area lighting applications, which is an important market for the near future. However, the main disadvantages of using PLED/OLED devices for large-area lighting are:

A low-workfunction metal such as Ba or Ca has to be used as cathode to make injection of electrons possible. These metals are very easily oxidized, which shortens the lifetime and requires special packaging of the device. the electroactive layer has to be thin (~70 nm) because the current, and thus the light output, decreases dramatically with increasing thickness. The processing of large-area layers of such thickness, avoiding shorts and light inhomogeneities, is very difficult.

A very promising alternative to PLED/OLED particularly for lighting applications is the light-emitting electrochemical cell (LEEC) (0). A LEEC does not need a low-workfunction metal electrode and thicker electroactive layers can be used, while keeping the operating voltage low. The operating mechanism is based on the presence of mobile ions.

Figure 1A:
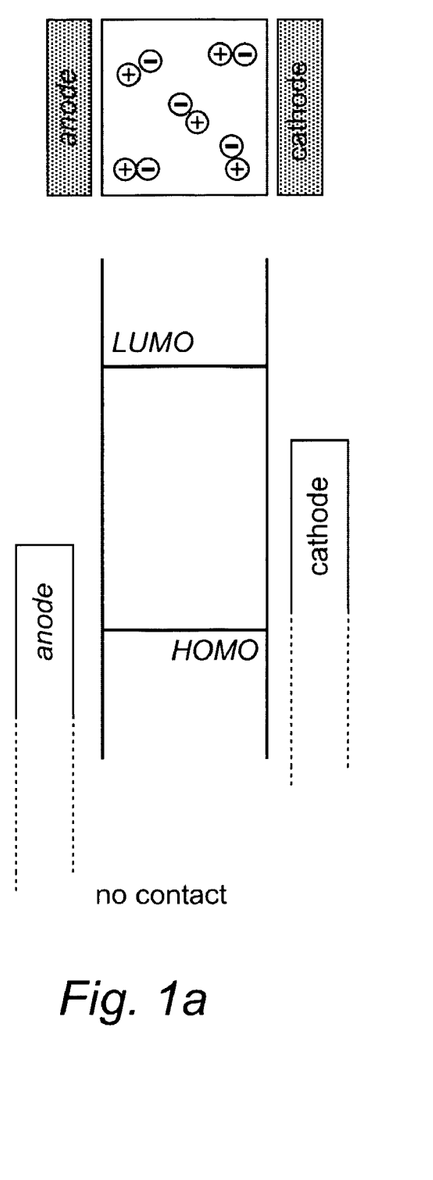
FIG. 1a shows the relative positions of the energy levels when the layers are not in contact.
Figure 1B:
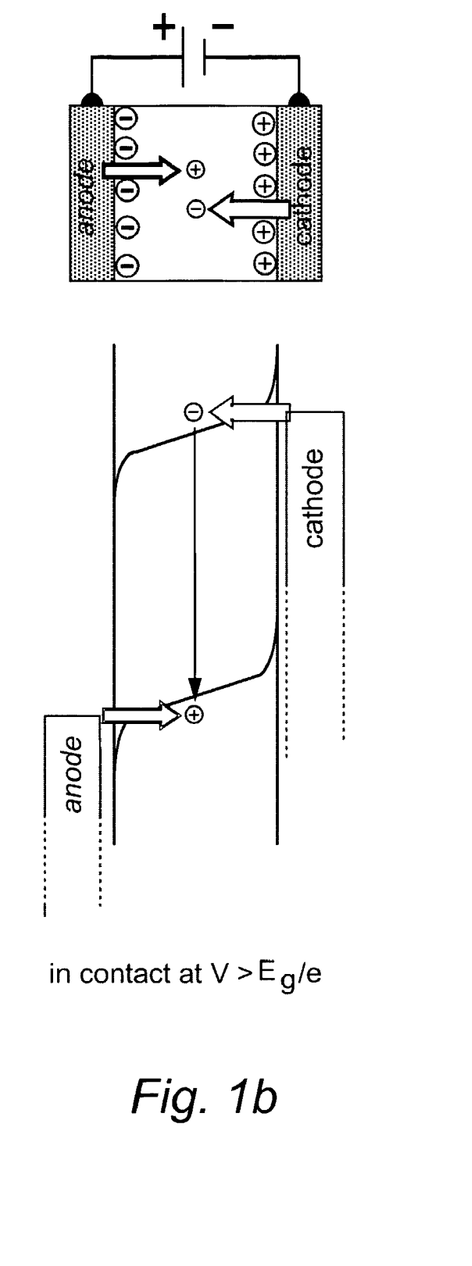
FIG. 1b shows the situation when a voltage is applied high enough to overcome the band gap of the electroluminescent layer.

FIG. 1 schematically shows the operating mechanism of a LEEC; the top pictures are cross sections, and the bottom pictures are energy band diagrams. (a) shows the relative positions of the energy levels when the layers are not in contact: the Fermi levels of the electrodes are not matched with the HOMO and LUMO levels of the electroluminescent layer. The ions in that layer reside in pairs. (b) shows the situation when a voltage is applied high enough to overcome the band gap of the electroluminescent layer: the ions have moved to opposite electrodes so that strong electric field gradients are created, making charge carrier injection and thus electroluminescence possible.

Thus, upon application of a voltage, the cations and anions move towards the cathode and anode respectively, leading to large electric field gradients at the electrode interfaces. The ion distribution formed facilitates injection of electrons and holes at the cathode and the anode respectively, thus allowing transport and recombination of the charge carriers, which results in emission of a photon.

Since the electric field over the electroactive layer is almost completely compensated at the electrode interfaces due to the ion distribution, charge injection is facilitated, even for thick layers. Moreover, matching of the Fermi levels of the electrodes with the energy levels of the electroactive layer is not needed, so that a variety of electrode materials can be used. For instance, non-reactive materials as Au, Ag, Al or ITO can be used as cathode instead of Ba or Ca.

One of the main problems for LEEC is that the performance in terms of efficiency has not yet reached the level of existing light sources or competing technologies for solid-state lighting (i.e. inorganic and organic LEDs). For instance, for a PolyLED containing a green-emitting Ir complex an external quantum efficiency (eqe) of 8% has been achieved (2), whereas for LEECs the eqe is generally in the order of or lower than 1%. Higher efficiencies for LEECs have been obtained but in most cases only at low brightness levels; the efficiency decreases rapidly before a reasonable brightness (e.g. 500 $Cd/m^2$) is reached. As an example, the highest eqe for a LEEC obtained, using a $Ru(bpy)_3^{2+}$ derivative, is 5.5% at a brightness in the range of 10-50 $Cd/m^2$ (0). In another case an eqe of 4% at ~200 $Cd/m^2$ was reported for a polyfluorene, but the device degraded very rapidly (0).

Slinker et al. have described LEECs based on an Ir complex (0). The complex used was $[Ir(ppy)_2(dtb-bpy)]^+(PF_6^-)$ (ppy=2-phenylpyridine; (dtb-bpy)=4,4'-di-tert-butyl-2-2'-dipyridyl). Quantum efficiencies of 5% were reported at −3V, i.e. under reverse bias operation. However, the corresponding luminance was only up to 330 $cd/m^2$, which is too low for lighting applications. Higher luminance levels could be obtained by applying a higher voltage (−5V) or by using a low-work function electrode (Ca), but in both cases the efficiency was not high over a reasonable luminance range, and also not stable.

All prior art LEECs thus suffer from the drawback of deteriorated brightness at higher efficiency levels. As a consequence thereof, the performance of LEECs needs to be improved in order to compete with technologies for solid-state lighting.

SUMMARY OF THE INVENTION

An object of the present invention is to provide LEECs having high efficiencies at high brightness levels.

This object is achieved by a light-emitting electrochemical cell (LEEC) comprising at least two electrodes, and an electroluminescent material arranged between said electrodes, wherein said electroluminescent material comprises a charged metal complex having at least one metal atom, said metal atom being selected from the group consisting of Ir, Os, Pt, Re and Zn, with the proviso that said metal complex is different from $[Ir(ppy)_2(dtb-bpy)]^+(PF_6^-)$ and $[Os(bpy)_2(dppe)]^{2+}(PF_6^-)_2$.

A light-emitting electrochemical cell according to the invention exhibits an external quantum efficiency of at least 1% extending over a luminance range of at least 1000 $cd/m^2$, where the lower limit of said range is at least 400 $cd/m^2$.

The charged metal complex comprises at least one chelating moiety, e.g. three chelating moieties. The metal atom in the metal complex is suitably Ir.

Examples of metal complexes according to the invention, which comprise an Ir-atom are $[Ir(ppy)_2(bpy)]^+(PF_6^-)$, $[Ir(ppy)_2(phen)]^+(PF_6^-)$, and $[Ir(ppy)_2(phenSO_3)]Na^+$.

The electroluminescent material may further comprise a substance selected from the group consisting of polyacrylates, polymethacrylates, polyethers, polyesters, polyolefines, polystyrenes, polysiloxanes or mixtures or mixtures or derivatives thereof. For example, the electroluminescent material may comprise polymethylmetacrylate (PMMA). Thereby, film formation is improved resulting in less leakage current and therefore higher efficiency.

The electrode of the LEEC may comprise a material selected from the group consisting of Au, Ag, Al, Pt, Cu, Zn, Ni, Fe, Pb, In, W, Pd, indium tin oxide (ITO), indium zinc oxide, lead oxide, tin oxide, graphite, doped silicon, doped germanium, doped gallium arsenide, doped polyalinine, doped polypyrrole, doped polythiophene, and derivatives and mixtures thereof. These materials are non-reactive and therefore very advantageous to use as electrodes.

Further, the present invention relates to a method for manufacturing a light-emitting electrochemical cell comprising arranging an electroluminescent material between at least two electrodes, wherein said electroluminescent material comprises a charged metal complex having at least one metal atom, said metal atom being selected from the group consisting of Ir, Os, Pt, Re and Zn, with the proviso that said metal complex is different from [Ir(ppy)$_2$(dtb-bpy)]$^+$(PF$_6^-$) and [Os(bpy)$_2$(dppe)]$^{2+}$(PF$_6^-$)$_2$.

The present invention also relates to the use of a charged metal complex having at least one metal atom, said metal atom being selected from the group consisting of Ir, Os, Pt, Re and Zn, with the proviso that said metal complex is different from [Ir(ppy)$_2$(dtb-bpy)]$^+$(PF$_6^-$) and [Os(bpy)$_2$(dppe)]$^{2+}$(PF$_6^-$)$_2$, as an electroluminescent substance.

Another aspect of the present invention relates to new charged metal complexes.

BRIEF DESCRIPTION OF THE DRAWINGS

FIGS. 1a and 1b generally show the operating mechanism of a LEEC, where

DESCRIPTION OF PREFERRED EMBODIMENTS

According to the present invention, the above-mentioned problems of LEECs have been solved by using a charged metal complex as the electroluminescent substance in LEECs. Examples of metals to be used in metal complexes according to the present invention are Ir, Os, Pt, Re and Zn.

A metal complex according to the invention can be generally described as a complex comprising a metal atom and chelating moieties which combine with the metal atom.

Examples of chelating moieties which may be used in the present invention are:

(I)

(II)

(III)

in which R$_1$ independently represents H, F, CF$_3$, branched or unbranched alkyl, alkyl ether, unsubstituted or substituted phenyl, fluorene, spirofluorene, sulfonate, or 4-sulfonatophenyl. However, other chelating moieties may be used as well.

As used herein a "chelating moiety" relates to a moiety which binds with a metal atom so as to form a chelate, i.e. a stable complex of a metal with one or more polydentate ligands.

The chelating moieties may be independently used, i.e. different chelating moieties may combine with the same metal atom. The number of chelating moieties may vary. For example, metals having six binding sites, e.g. Ir, combine with three of the above chelating moieties, while metals having four binding sites, e.g. Pt, combine with two of the above chelating moieties.

R$_1$ may independently represent different groups, i.e. there may be different R$_1$ groups on one chelating moiety.

The metal complexes according to the invention suitably comprise an Ir-atom. Such metal complexes can be generally described by the following formulas IV, V and VI (R$_2$, R$_3$ and R$_4$ are defined below):

(IV)

wherein $R_2$ independently represents H, F, $CF_3$, branched or unbranched alkyl, alkyl ether, unsubstituted or substituted phenyl, fluorene, or spirofluorene;

$R_3$ represents an anion selected from the group consisting of fluorine, chlorine, bromine, iodine, perchlorate, bromate, nitrate, tetrafluoroborate, hexafluorophosphate ($PF_6^-$), n-butyrate, trifluoromethane sulfonate, trifluoromethane sulfonimide, acetate, trifluoroacetate, tetraphenyl borate, toluene sulfonate, dodecylbenzene sulfonate, camphor sulfonate, picrate, thiocyanate, benzoate, or mixtures thereof;

$R_4$ represents a cation selected from the group consisting of lithium, sodium ($Na^+$), potassium, rubidium, cesium, silver, copper, ammonium, tetramethyl ammonium, tetraethyl ammonium, tetrapropyl ammonium, tetrabutyl ammonium, tetradecyl ammonium, tribenzyl ammonium, phenyl ammonium, or mixtures thereof.

$R_2$ may independently represent different groups, i.e. there may be different $R_2$ groups in one metal complex.

Examples of such complexes are $[Ir(ppy)_2(bpy)]^+(PF_6^-)$, $[Ir(ppy)_2(phen)]^+(PF_6^-)$, and $[Ir(ppy)_2(phenSO_3)]^-Na^+$, where ppy=2-phenylpyridine, bpy=2,2'-bipyridine, phen=4,7-diphenyl-1,10-phenanthroline, phenSO_3=4,7-di(4-sulfonatophenyl)-1,10-phenanthroline disulfonate.

The term "$Ir(ppy)_2(bpy)]^+(PF_6^-)$" as used herein relates to a compound of formula IV in which $R_2$=H and $R_3$=$PF_6^-$.

The term "$[Ir(ppy)_2(phen)]^+(PF_6^-)$" as used herein relates to a compound of formula V in which $R_2$=H and $R_3$=$PF_6^-$.

The term "$[Ir(ppy)_2(phenSO_3)]^-Na^+$" as used herein relates to a compound of formula VI in which $R_2$=H and $R_4$=$Na^+$.

Although the general formulas IV, V, and VI above describe metal complexes in which the metal atom is Ir, it is to be understood that other metal atoms, e.g. Os, Pt, Re, or Zn, could also be used. The number of chelating moieties will vary depending on the number of binding sites of the metal atom. Further, combinations of one or more of the complexes according to the invention may be used as an electroluminescent material.

Figure 2:
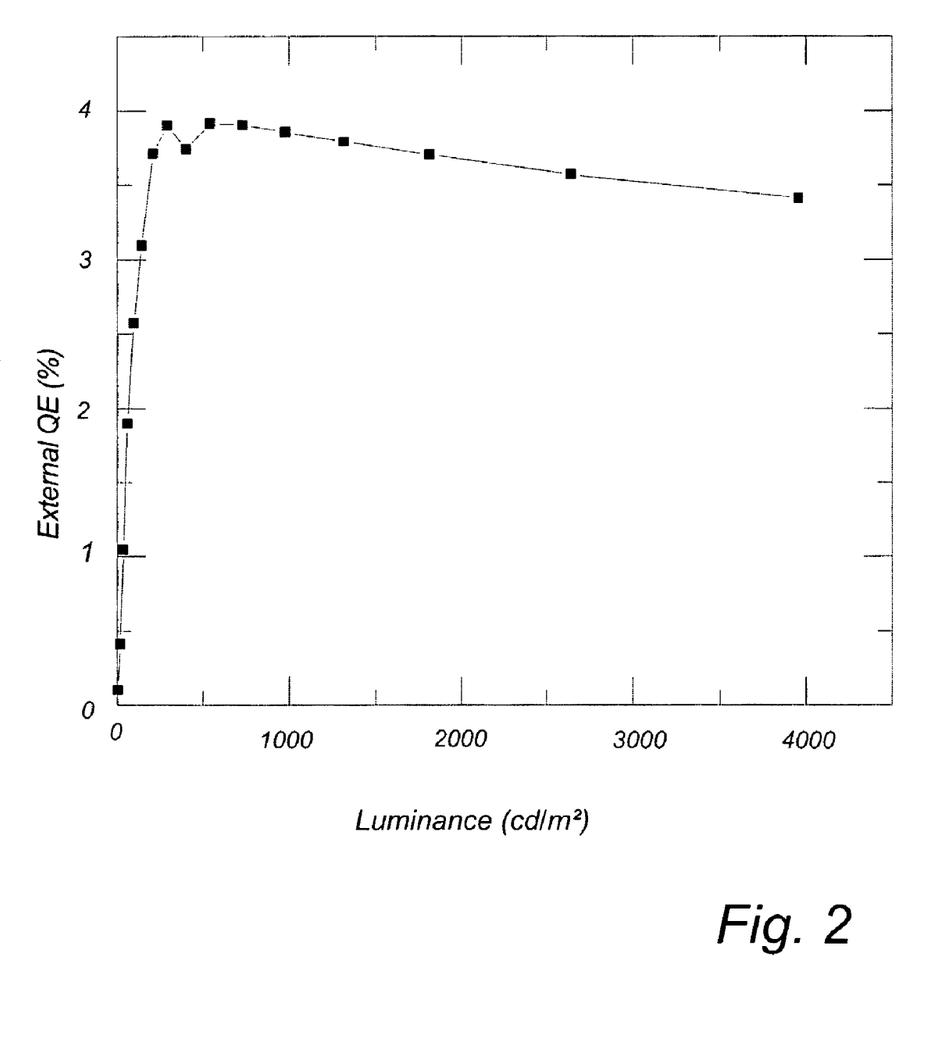
FIG. 2 shows the external quantum efficiency against luminance for an ITO/[Ir(ppy)$_2$(bpy)]$^+$(PF$_6^-$)+PMMA/Ag device.
Figure 3A:
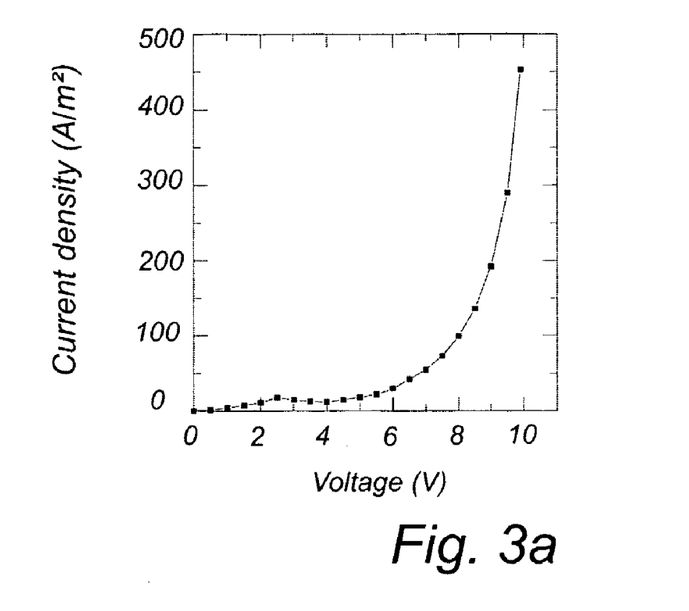
FIG. 3 shows the current-voltage-light characteristics of an ITO/[Ir(ppy)$_2$(bpy)]$^+$(PF$_6^-$)+PMMA/Ag device: (a) current density against voltage, (b) luminance against voltage, (c) luminance against current density, (d) external quantum efficiency against current density.
Figure 3B:
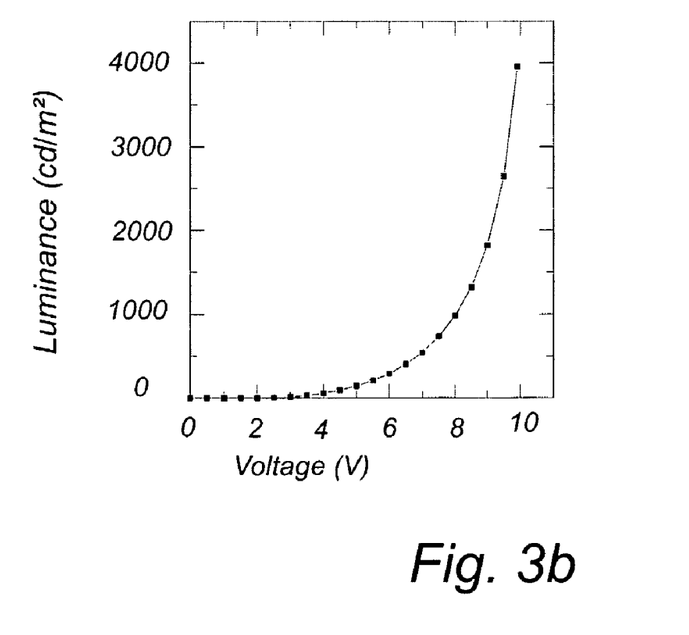
Figure 3C:
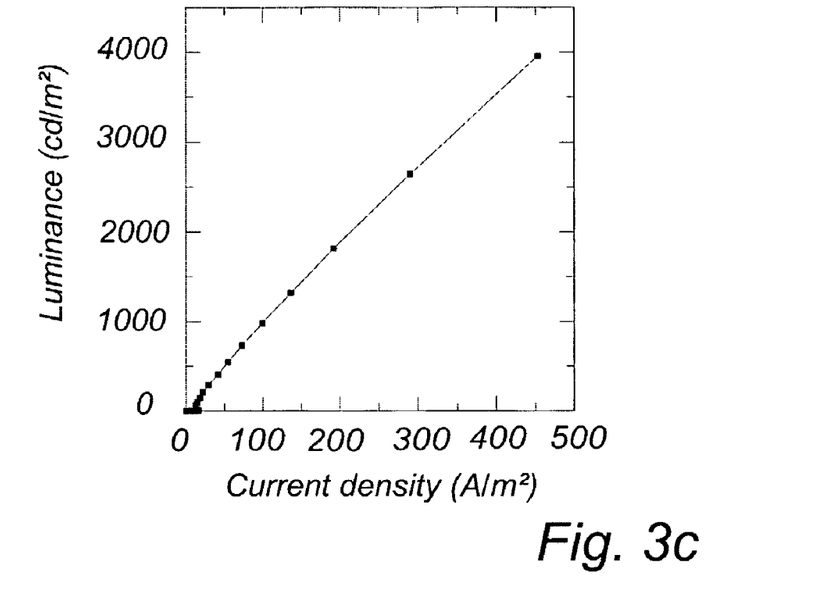
Figure 3D:
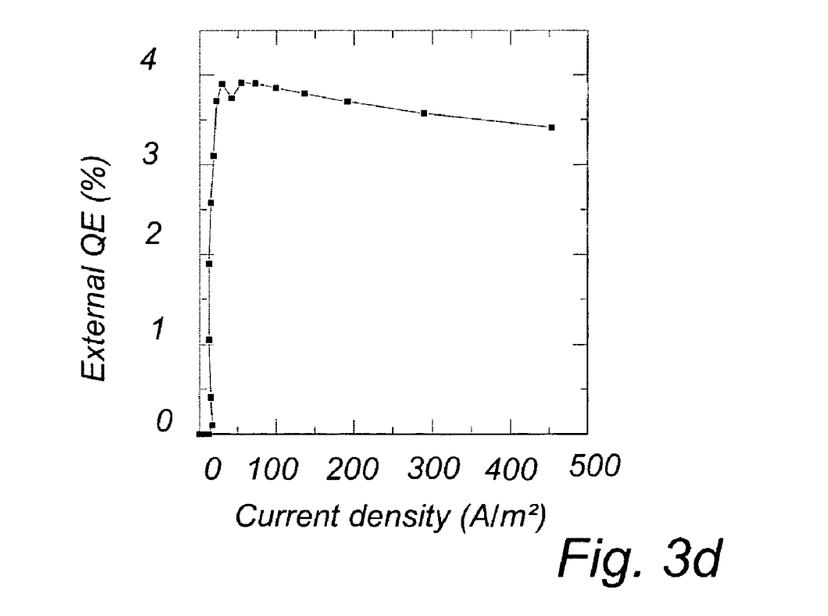

By using the above described complex $[Ir(ppy)_2(bpy)]^+$ $(PF_6^-)$ as the electroluminescent material in a LEEC, an eqe of nearly 4% can be obtained, which remains fairly constant over a brightness range of 500-4000 $Cd/m^2$ (see FIG. 2). Thus, the present inventors surprisingly found that charged metal complexes may be used as an electroluminescent material in a light-emitting electrochemical cell for applications requiring an external quantum efficiency of at least 1% extending over a luminance range of at least 1000 $Cd/m^2$, where the lower limit of said range is at least 400 $Cd/m^2$. Alternatively, the lower limit is 500 $Cd/m^2$ or 600 $Cd/m^2$.

As used herein, "external quantum efficiency" (eqe) relates to the product of internal quantum efficiency and light-extraction efficiency, where the internal quantum efficiency relates to the fraction of injected charge carriers that recombine to produce photons, and light-extraction efficiency relates to the fraction of photons that escape from the device.

The present inventors have thus found that the metal complexes according to the present invention perform much better as electroluminescent substances than the known metal complexes, e.g. $[Ir(ppy)_2(dtb-bpy)]^+(PF_6^-)$ (5)(8), which have previously been used for the same purpose. Prior art does not disclose any charged metal complexes, used as an electroluminescent material, which combine such high levels of external quantum efficiency with high luminance levels.

While the use of Ir-complexes as triplet emitters in OLEDs is well known, their use in LEECs is new. The reason for this difference is that an Ir-complex in an OLED only functions as the emitter, whereas in a LEEC it is the single electroactive compound. As a consequence, next to a high luminescence efficiency it has to fulfil additional functions: it has to provide mobile ions and thus the complex should be charged, and it has to be able to transport both electrons and holes. The complexes according to the invention satisfy all these conditions.

The complex $Ir(Ppy)_2(bpy)]^+(PF_6^-)$ is previously known from the literature: Ohsawa et al. (0) and Plummer et al. (0) reported on its photoluminescence in solution, but not on electroluminescence.

As stated above, a light-emitting electrochemical cell according to the invention may also comprise other charged metal complexes in the electroluminescent material. Beside Ir, the metal in the complexes may e.g. be selected from the group consisting of Os, Zn, Re, or Pt.

The present inventors have found that neutral Zn complexes exhibit photoluminescence quantum efficiencies of up to 80% in solution. Neutral Pt and Re complexes have been used to make efficient small-molecule light-emitting diodes (9)(10). By attaching charged groups e.g. sulfonate groups these complexes become charged and therefore suitable for use in high-efficiency LEECs. The first LEEC known with an Os complex, i.e. $[Os(bpy)_2L]^{2+}(PF_6^-)_2$ where L is cis-1,2-bis (diphenyl-phosphino)ethylene, gave an eqe close to 1% (11), making Os another suitable metal to be used in efficient LEECs. However, prior art does not disclose Os-complexes having high efficiencies at high brightness levels, which characterize the complexes according to the present invention.

In the research work leading to the present invention, electroluminescent devices were made with the complex $Ir(ppy)_2(bpy)]^+(PF_6^-)$ by adding some PMMA (to improve film formation) and sandwiching this mixture between ITO and Ag electrodes. For these devices a fairly constant eqe of 3.5-4% was found at 500-4000 Cd/m² luminance.

For comparison, devices prepared in a similar way but with the well-known complex $[Ru(bpy)_3]^{2+}(PF_6^-)_2$ instead of $[Ir(Ppy)_2(bpy)]^+(PF_6^-)$ had an eqe of 0.9% at 100 Cd/m² decreasing to ~0.7% at 600 Cd/m². Thus, the complexes according to the invention provide a very big step towards bringing the efficiency of LEECs closer to what is needed for application in solid-state lighting.

The term "light-emitting electrochemical cell" as used herein refers to a device comprising at least two electrodes, inbetween which is placed a material or blend of materials capable of electroluminescence, where this material or a material in the blend of materials is ionic in nature.

Suitable materials for use as an electrode according to the invention are e.g. Au, Ag, Al, Pt, Cu, Zn, Ni, Fe, Pb, In, W, Pd, indium tin oxide (ITO), indium zinc oxide, lead oxide, tin oxide, graphite, doped silicon, doped germanium, doped gallium arsenide, doped polyalinine, doped polypyrrole, doped polythiophene, and derivatives and mixtures thereof. Other suitable electrode materials are well known to a man skilled in the art. In addition, alloys of the previously mentioned materials may be used as an electrode according to the present invention.

Both electrodes can in principle be the cathode or the anode. The cathode is defined as the electron-injecting electrode, while the anode is the hole-injecting electrode.

The term "anode" as used herein refers to an electrically conductive layer, which is used as electrode for hole injection into the electroluminescent material under appropriate biasing conditions.

An anode according to the invention may be structured, e.g. segmented into separately addressable pixels or connected in series or parallel or intact, possibly with additional thick metal strips for uniform shunting of the currents over large areas.

The term "cathode" as used herein refers to an electrically conductive layer, which is used as electrode for electron injection into the electroluminescent material under appropriate biasing conditions.

A cathode according to the invention may be structured or intact, e.g. segmented into separately addressable pixels, or connected in series or parallel or intact, possibly with additional thick metal strips for uniform shunting of the currents over large areas.

In a LEEC according to the invention the electroluminescent material is arranged between an anode and a cathode. By the term "arranged between", in this context, is meant that the electroluminescent material is electrically in contact with the anode and the cathode in such a way that holes and electrons can be introduced into the electroluminescent material and electroluminescence is achieved, under appropriate biasing conditions. For example, the electroluminescent material may be sandwiched between two electrode layers.

In another embodiment, the electroluminescent material may be deposited on top of a substrate with predefined anode and cathode electrodes, which are spatially and electrically separated from each other, to form a lateral LEEC.

In yet another embodiment both anode and cathode material may be deposited, with a spatial and electrical separation from each other, on top of the electroluminescent material, thus resulting in a lateral LEEC.

According to the present invention, the electroluminescent material may be mixed with e.g. polymethylmethacrylate, PMMA, in order to improve film formation. Other polymethacrylates could also be added to the electroluminescent material, as well as polyacrylates, polyethers, such as polyethylene oxide or polyethylene glycol, polyesters such as polycarbonates, polyolefines such as Zeonex™, polystyrenes, polysiloxanes or mixtures or derivatives thereof.

The thickness of the electroluminescent material arranged between the electrodes may vary. For example, the thickness may be in the range of 5 nm to 1 cm, or in the range of 5 nm to 1 mm, or in the range of 10 nm to 0.1 mm.

In the method for manufacturing a LEEC according to the invention, the LEEC may be manufactured on a glass substrate. Suitable substrates may be rigid or mechanically flexible and include, beside glass, metals, alloys and plastics. Examples of flexible substrates include PET foil glued temporarily on a carrier substrate, flexible steel foils, silicon, and silicon oxide.

The present invention also relates to novel Ir complexes, The complexes can be positively as well as negatively charged i.e. can have negative as well as positive counterions. $[Ir(ppy)_2(phen)]^+(PF_6^-)$ and $[Ir(ppy)_2(phenSO_3)]^-Na^+$. These complexes also have high photoluminescence quantum efficiencies.

EXAMPLES

Example 1

Synthesis of $[Ir(ppy)_2(phen)]^+(PF_6^-)$ $Ir_2Cl_2(ppy)_2$ (0.123 mmol) and bathophenanthroline (0.194 mmol) were heated to reflux in a dichloromethane-methanol (3:1, 20 ml) solution under a nitrogen atmosphere for 3 hours. The volume of the solution was reduced to 5 ml and 10 ml methanol was added. An excess of saturated methanolic ammonium hexafluorophosphate was added. The resulting precipitate was filtered off and washed with ether (20 ml) to yield the desired product in 60-70%.

Example 2

Synthesis of $[Ir(ppy)_2(phenSO_3)]^-Na^+$ $Ir_2Cl_2(ppy)_2$ (0.123 mmol) and bathophenanthroline disulfonic acid disodium salt hydrate (0.194 mmol) were heated to reflux in a chloroform-methanol (8:2, 20 ml) solution under a nitrogen atmosphere for 2 hours. The purification was achieved by gel-chromatography, using a silica column and 9:1 chloroform-methanol as eluent. The desired product was obtained in a 60-70% yield.

Example 3

Preparation of a LEEC Comprising $[Ir(ppy)_2(bpy)]^+(PF_6^-)$ $[Ir(ppy)_2(bpy)]^+(PF_6^-)$ was prepared following literature (6). 59.93 mg of the complex was dissolved in 1.5 ml acetonitrile by stirring at 50° C. for 30 min. To this solution was added 0.8 ml of a 25 mg/ml solution of PMMA in acetonitrile. By this way the weight ratio $[Ir(ppy)_2(bpy)]^+(PF_6^-)$: PMMA in the mixture became 3:1. The solution was stirred at 45° C. for 30 min.

Next, molecular sieves were added in order to remove traces of water. The solution was brought into a nitrogen atmosphere glovebox, where all subsequent processing was carried out. After 30 min. the solution was filtrated and spin-coated on glass substrates with structured ITO, which had been thoroughly cleaned beforehand using soap, water, isopropanol, ultrasound and UV-ozone. This resulted in homogeneous films of 100-200 nm thick.

The films were dried at 100° C. in nitrogen for about 1 hour. A 100 nm thick Ag electrode was evaporated on top in a vacuum chamber at about $10^{-7}$ mbar at a rate of 0.5 nm/s. This resulted in 4 LEEC devices per substrate, of which the 2 smallest ones (3×3 and 4×4 mm) were tested on electroluminescence. First a voltage in the order of +10-+14 V (i.e. ITO biased positively) was applied until a steady light-emission level was reached. Next current and photocurrent as a function of voltage were measured by going from high to low voltage and letting the system reach equilibrium at every voltage.

FIG. 3 shows the results obtained for the 4×4 mm device of a sample with a 135 nm thick electroactive layer. The photocurrent could be converted into luminance after calibrating the photodiode with a luminance meter. Subsequently the external quantum efficiency could be calculated with the aid of the electroluminescence spectrum recorded.

Figure 4:
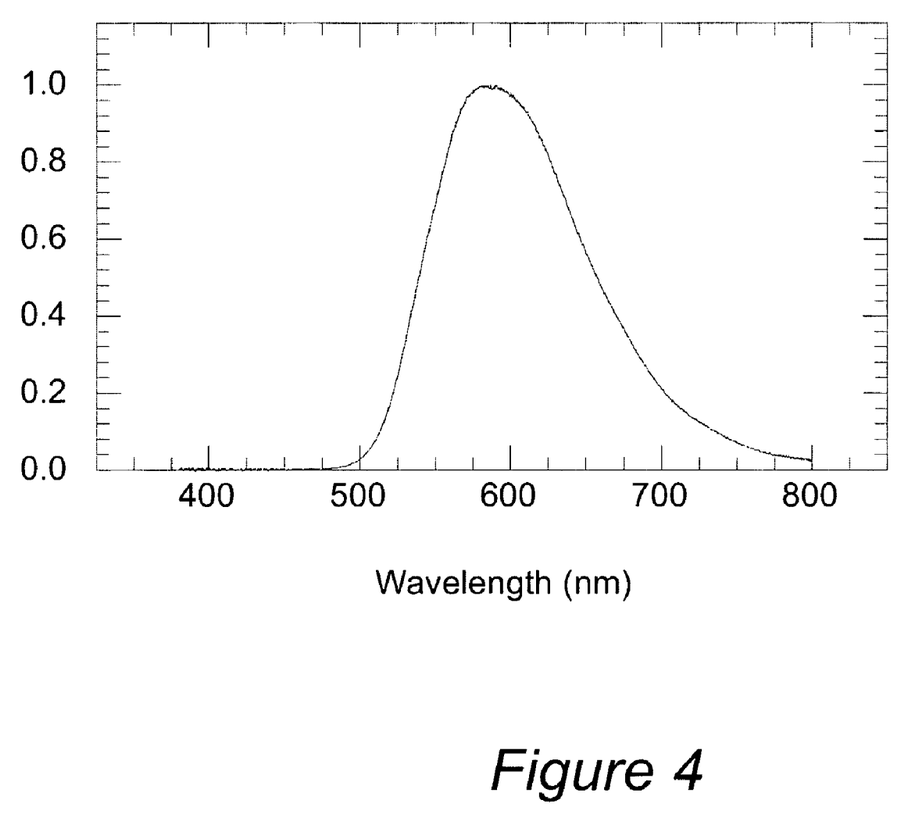
FIG. 4 shows the electroluminescence spectrum of an ITO/[Ir(ppy)$_2$(bpy)]$^+$(PF$_6^-$)+PMMA/Ag device.

As can be seen from FIGS. 3 (c) and (d), the eqe is 3.9% at a luminance of 300 Cd/m², and decreases slightly to 3.4% at 4000 Cd/m². This corresponds with an efficacy decreasing from 10 to 9 Cd/A (from 5 to 3 lm/W), as the emission is in the yellow-orange (see FIG. 4). At 1000 Cd/m² the efficacy is 4 lm/W, a value that can compete with state-of-the-art thin-film electroluminescence (inorganic). Moreover the broad emission centered in the yellow-orange is very interesting for lighting applications, because combination with a blue emitter gives white light.

The LEECs according to the invention can be applied in large-area lighting systems, optionally colour-tunable, for example for general lighting, for atmosphere creation, for car interior lighting (roof, walls, dashboard), for decorative lighting, and for in- and outdoor signage.

REFERENCES

1. Pei, Q.; Yu, G.; Zhang, C.; Yang, Y.; Heeger, A. J. *Science* 1995, 269 1086-1088.
2. Plummer, E.; Brunner, K.; Hofstraat J. W.; and De Cola L., submitted for publication.
3. Rudmann, H.; Shimada, S.; Rubner, M. F. *Journal of the american chemical society* 2001, 124 4918-4921.
4. Yang, Y.; Pei, Q. *Journal of Applied Physics* 1997, 81(7), 3294-3298.
5. Slinker, J.; Bernards, D.; Houston, P. L.; Abruña, H. D.; Bernhard, S.; Malliaras, G. G. *Chemical Communications* 2003, 19 2392-2399.
6. Ohsawa, Y.; Sprouse, S.; King, K. A.; DeArmond, M. K.; Hanck, K. W.; Watts, R. J. *Journal of Physical Chemistry* 1987, 91 1047-1054.
7. Plummer, E. A.; Hofstraat, J. W.; De Cola, L. *Dalton Transactions* 2003, 2080-2084.
8. Slinker, J.; Gorodetsky A.; Lowry M.; Wang J.; Parker S.; Rohl, R.; Bernhard, S.; Malliaras, G. *Journal of the american chemical society* 2004, 126 2763-2767.
9. D'Andrade, B. W.; Brooks, J.; Adamovich, V.; Thompson, M. E.; Forrest, S. R. *Advanced Materials* 2002, 14 1032-1036.
10. Li, F.; Zhang, M.; Cheng, G.; Feng, J.; Zhao, Y.; Ma, Y.; Liu, S.; Shen, J. *Applied Physics Letters* 2004, 84 148-150.
11. Bernhard, S.; Gao, X.; Malliaras, G. G.; Abruña, H. D. *Advanced Materials* 2002, 14 433-436.

The invention claimed is:

1. A light-emitting electrochemical cell comprising at least two electrodes, and an electroluminescent material arranged between said electrodes, wherein said electroluminescent material comprises a charged metal complex having at least one metal atom, said metal atom being selected from the group consisting of Ir, Os, Pt, Re and Zn, with the proviso that said metal complex is different from [Ir(ppy)$_2$(dtb-bpy)]$^+$ (PF$_6^-$) and [Os(bpy)$_2$(dppe)]$^{2+}$(PF$_6^-$)$_2$, and wherein said charged metal complex comprises at least one chelating moiety selected from the group consisting of the compounds of the following formulas I, II and III:

in which R$_1$ consists of one of F, CF$_3$, branched or unbranched alkyl, alkyl ether, unsubstituted or substituted phenyl, fluorene, spirofluorene, sulfonate, or 4-sulfonatophenyl.

2. The light-emitting electrochemical cell according to claim 1, exhibiting an external quantum efficiency of at least 1% extending over a luminance range of at least 1000 cd/m², wherein the lower limit of said range is at least 400 cd/m².

3. The light-emitting electrochemical cell according to claim 1, wherein said metal atom is Ir.

4. The light-emitting electrochemical cell according to claim 1, wherein said charged metal complex is selected from the group consisting of the compounds of the following formulas IV, V and VI:

-continued in which:
- $R_2$ independently represents H, F, $CF_3$, branched or unbranched alkyl, alkyl ether, unsubstituted or substituted phenyl, fluorene, or spirofluorene;
- $R_3$ represents an anion selected from the group consisting of fluorine, chlorine, bromine, iodine, perchlorate, bromate, nitrate, tetrafluoroborate, hexafluorophosphate ($PF_6^-$), n-butyrate, trifluoromethane sulfonate, trifluoromethane sulfonimide, acetate, trifluoroacetate, tetraphenyl borate, toluene sulfonate, dodecylbenzene sulfonate, camphor sulfonate, picrate, thiocyanate, benzoate, or mixtures thereof;
- $R_4$ represents a cation selected from the group consisting of lithium, sodium, potassium, rubidium, cesium, silver, copper, ammonium, tetramethyl ammonium, tetraethyl ammonium, tetrapropyl ammonium, tetrabutyl ammonium, tetradecyl ammonium, tribenzyl ammonium, phenyl ammonium, or mixtures thereof.

5. The light-emitting electrochemical cell according to claim 1, wherein said electroluminescent material further comprises a substance selected from the group consisting: of polyacrylates, polymethacrylates, polyethers, polyesters, polyolefines, polystyrenes, polysiloxanes or mixtures or derivatives thereof.

6. The light-emitting electrochemical cell according to claim 1, wherein said electrodes comprise a material selected from the group consisting of: Au, Ag, Al, Pt, Cu, Zn, Ni, Fe, Pb, In, W, Pd, indium tin oxide (ITO), indium zinc oxide, lead oxide, tin oxide, graphite, doped silicon, doped germanium, doped gallium arsenide, doped polyalinine, doped polypyrrole, doped polythiophene, and derivatives and mixtures thereof.

7. A substance having the formula:

in which:
- $R_2$ independently represents H, F, $CF_3$, branched or unbranched alkyl, alkyl ether, unsubstituted or substituted phenyl, fluorene, or spirofluorene;
- $R_3$ represents an anion selected from the group consisting of fluorine, chlorine, bromine, iodine, perchlorate, bromate, nitrate, tetrafluoroborate, hexafluorophosphate ($PF_6^-$), n-butyrate, trifluoromethane sulfonate, trifluoromethane sulfonimide, acetate, trifluoroacetate, tetraphenyl borate, toluene sulfonate, dodecylbenzene sulfonate, camphor sulfonate, picrate, thiocyanate, benzoate, or mixtures thereof, the substance further comprising at least one chelating moiety selected from the group consisting of the compounds of the following formulas I, II and III:

in which $R_1$ consists of one of F, $CF_3$, branched or unbranched alkyl, alkyl ether, unsubstituted or substituted phenyl, fluorene, spirofluorene, sulfonate, or 4-sulfonato-phenyl.

8. A substance having the formula:

in which:

$R_2$ independently represents H, F, $CF_3$, branched or unbranched alkyl, alkyl ether, unsubstituted or substituted phenyl, fluorene, or spirofluorene;

$R_4$ represents a cation selected from the group consisting of lithium, sodium, potassium, rubidium, cesium, silver, copper, ammonium, tetramethyl ammonium, tetraethyl ammonium, tetrapropyl ammonium, tetrabutyl ammonium, tetradecyl ammonium, tribenzyl ammonium, phenyl ammonium, or mixtures thereof, the substance further comprising at least one chelating moiety selected from the group consisting of the compounds of the following formulas I, II and III:

in which $R_1$ consists of one of F, $CF_3$, branched or unbranched alkyl, alkyl ether, unsubstituted or substituted phenyl, fluorene, spirofluorene, sulfonate, or 4-sulfonato-phenyl.

* * * * *